United States Patent [19]

Akiyama

[11] Patent Number: 5,675,522

[45] Date of Patent: Oct. 7, 1997

[54] METHOD AND SYSTEM FOR DIVIDING ANALYZING REGION IN DEVICE SIMULATOR

[75] Inventor: Yutaka Akiyama, Tokyo, Japan

[73] Assignee: NEC Corporation, Tokyo, Japan

[21] Appl. No.: 661,763

[22] Filed: Jun. 11, 1996

Related U.S. Application Data

[63] Continuation of Ser. No. 306,967, Sep. 16, 1994, abandoned.

[30] Foreign Application Priority Data

Sep. 17, 1993 [JP] Japan .................................. 5-230632

[51] Int. Cl.⁶ ..................................................... G06F 15/60
[52] U.S. Cl. ........................... 364/578; 364/488; 364/489; 364/490; 364/491
[58] Field of Search ............................ 364/578, 488–491

[56] References Cited

U.S. PATENT DOCUMENTS

| | | | |
|---|---|---|---|
| 4,754,408 | 6/1988 | Carpenter et al. | 364/491 |
| 4,791,593 | 12/1988 | Hennion | 364/578 |
| 4,912,664 | 3/1990 | Weiss et al. | 364/557 |
| 4,969,116 | 11/1990 | Wada et al. | 364/578 |
| 5,125,038 | 6/1992 | Meshkat et al. | 382/154 |
| 5,305,395 | 4/1994 | Mahoney et al. | 382/205 |
| 5,428,726 | 6/1995 | Piegl et al. | 395/141 |
| 5,435,310 | 7/1995 | Sheehan et al. | 128/653.1 |
| 5,440,674 | 8/1995 | Park | 395/123 |
| 5,465,323 | 11/1995 | Mallet | 395/123 |

OTHER PUBLICATIONS

Sangyo Tosho, "Process Device Stimulation Technology", pp. 113–122.

Rafferty et al., "Iterative Methods in Semiconductor Device Simulation", IEEE Transactions on Electron Devices, vol. Ed–32, No. 10, Oct. 1985, pp. 2018–2019.

M.S. Mock, "Tetrahedral Elements and the Scharfetter-Gummel Method", Proceeding of the NASECODE, IV, (1985), pp. 36–47.

*Primary Examiner*—Kevin J. Teska
*Assistant Examiner*—A. Roberts
*Attorney, Agent, or Firm*—Foley & Lardner

[57] ABSTRACT

In order to divide an analyzing region in a semiconductor device into a plurality of fractional elements of a predetermined configuration, the analyzing region is initially divided into an arbitrary number of the fractional elements. With respect to a newly added nodal point, the fractional elements enclosing the new nodal point within a circumscribing range thereof are extracted as objective fractional elements for further division. Among the extracted fractional elements, specific fractional element having the perimetric fraction located within a predetermined modifying the perimeter of the fractional element group consisted of the extracted fractional elements. The fractional elements are re-establishes on the basis of the modified perimeter and the new nodal point.

18 Claims, 12 Drawing Sheets

METHOD AND SYSTEM FOR DIVIDING ANALYZING REGION IN DEVICE SIMULATOR

This application is a continuation of application Ser. No. 08/306,967, filed Sep. 16, 1994, now abandoned.

BACKGROUND OF THE INVENTION

1. Field of the Invention

The present invention relates generally to a method and a system for dividing a region to be analyzed (analyzing region) of a semiconductor device in a device simulation technology. More specifically, the invention relates to a method and a system for dividing an analyzing region into tetrahedral fractional regions.

2. Description of the Related Art

In fabrication of semiconductor device, simulation has been performed employing a device simulator which calculates physical amount in the semiconductor device using a computer and deriving electric characteristics, such as terminal current, threshold voltage and so forth of a transistor. Upon performing optimization of the transistor for attaining optimal electric characteristics of the semiconductor device, it can significantly save expense and period by employing the device simulator in comparison with experimentally fabricating actual LSI. Also, since the physical amount in the semiconductor device is calculated in the device simulator, it is possible to check behavior of electron and hole within the semiconductor. Therefore, it becomes possible to use it for clearing up the cause of impact ionizing phenomenon which causes problems in fine MOSFET.

In the device simulator, in order to obtain the physical amount within the semiconductor transistor, separative variation within the semiconductor is analyzed by solving a partial differential equation, such as Poisson equation expressing relationship between a potential and a carrier concentration and current continuity equation and so forth expressing relationship between a potential and a carrier concentration. A method for solving such partial differential equation is disclosed in Dan, "Process Device Simulation Technology" (edited: Sangyo Tosho), pp 113 to 122. In the above-identified literature, there is disclosed a method, in which the semiconductor device is divided into small fractional regions for calculating the partial differential equation in a discrete manner. Also, there is disclosed, as a method for discretion two-dimensional section of the semiconductor, to divide a transistor structure into a rectangular grid and define current between each grid points. In such discretion method employing the rectangular shaped fractional elements, respective grid points are connected to adjacent grid points by grid lines, as shown in FIG. 14. In the solution of the partial differential equation set forth above, a section is defined by an intersection of perpendicular bisectors of the grid lines, and the current between the grid points is integrated by the section.

However, when the semiconductor device is divided into quadrangular or rectangular parallelpiped fractional regions and if the semiconductor device has oblique configuration, such oblique configuration has to be approximated in the stepwise manner to make it impossible to exactly express the configuration. As a measure for this program, there is a method disclosed in C. S. Rafferty et al. "Iterative methods In Semiconductor Device Simulation" (IEEE Trans. on ED. Vol. ED-32, No. 10, October 1985). In the literature, in order to accurately describe the configuration of the semiconductor device, the semiconductor device is divided into triangular fractional regions (triangular elements). By employing the triangular elements, trench structure can be accurately described. FIG. 15 shows a current and its integration method in the case where the triangular elements are employed for division. As shown, different from the case where the rectangular element is employed for discretion, respective grid points are connected to a plurality of adjacent grid points via the grid lines, and the current is defined on the grid lines. The current between the grid points is integrated by the section of a current path associated with the grid line.

Since the section of the current path is described by a line connecting the circumcenters of triangular elements at both sides of the relevant edge, it is essential that the circumcenters of adjacent triangular elements will not intersect with each other. Namely, when the circumcenters of the triangular elements intersect, the section of the current path for integrating the current becomes negative. When this condition is not satisfied, it causes physically impossible projection having quasi Fermi level of 50 V. In order to avoid this, it is necessary to satisfy the condition that the circumncenters of the adjacent triangular element will not intersect. This may be achieved by achieving Delaunay division, in which no peak of other triangular elements is present within a circumscribed circle of the triangular element.

On the other hand, according to down-sizing of the device size depending upon increasing of package density of LSI, it is now necessary to perform device simulation while taking configuration of the transistor in the width direction with respect to narrow channel effect of MOSFET. For dividing such three dimensional arbitrary configuration into small fractional regions, the above-mentioned case of two-dimensional division with the triangular elements is extended to define the current on the edges of tetrahedral element, and the section of the current path is expressed as a surface connecting circumcenters of tetrahedral element group having the relevant edge in common. Similarly to the case of the two-dimensional division, when division is performed with the tetrahedral elements in the case of three-dimensional division, it should be Delaunay division to have no peak of other tetrahedral elements within a circumscribed sphere of the divided tetrahedral element. A method for realizing Delaunay division has been disclosed in M. S. Mock, "Tetrahedral Elements and the Scharfetter-Gummel Method" (Proceeding of the NASECODE, IV, PP 36 to 47, 1985). In this literature, discussion for the method is given with the case of two-dimensional division taken as an example, that boundary points of the material or points necessary for improving accuracy of calculation in the triangular element group already divided by Delaunay division are taken as new nodal points to add in one-by-one basis to further division into smaller fractional regions.

FIG. 11 is a flowchart for explaining method of Delaunay division with employing the tetrahedral element as set forth above, At first, within existing tetrahedral element group which has been already divided by Delaunay division, new nodal point is added depending upon necessity (step 1101). Then, tetrahedral elements enclosing the new nodal point within the circumscribed spheres are extracted (step 1102). Subsequently, the extracted tetrahedral elements are deleted (step 1103).

The boundary planes between the deleted tetrahedral elements (having the circumscribed spheres enclosing the new nodal point) and the remaining tetrahedral elements (having the circumscribed spheres not enclosing the new nodal point) are aggregate of triangular planes. Respective of the triangular planes are defined as outermost triangular planes. Then, with taking respective of the outermost triangular planes of the deleted tetrahedral element group as bottom planes and the new nodal point as peak, new tetrahedral elements are established.

However, in the conventional method as set forth above, when the new nodal point is added, it is possible to cause error in judgement whether the circumscribed sphere encloses the new nodal point or not due to numerical error in a computer system to cause failure of Delaunay division.

The concrete example will be shown in FIGS. 12 and 13. As shown in FIG. 12, consideration is given for the case where new nodal point is added for the Delaunay divided four tetrahedral elements a), b), c) and d). It is assumed that the new nodal point is located on the intersecting planes of circumscribed spheres of the tetrahedral elements a) and b). In such case, in the normal state, judgement should be made that both of the circumscribed spheres of the tetrahedral elements a) and b) enclose the new nodal points, or in the alternative that both of the circumscribed spheres of the tetrahedral elements a) and b) do not enclose the new nodal points. Here, judgement whether the circumscribed sphere encloses the new nodal point or not is made on the basis of the "distance between the circumcenter of the tetrahedral element and the new nodal point" and the radius of the circumscribed sphere. However, in the practical computer operation, judgement for which is larger is made with finite digits of values. Therefore, when the new nodal point is present on the intersecting plane of the spherical surface of the circumscribed spheres of the tetrahedral elements a) and b), it is possible to cause such contradiction that while the new nodal point is enclosed within the circumscribed sphere of the tetrahedral element a), it is not enclosed within the circumscribed sphere of the tetrahedral element b).

In this case, since the circumscribed spheres of the tetrahedral elements c) and d) clearly enclose the new nodal points, the tetrahedral elements a), c) and d) are deleted to establish new tetrahedral elements with the outermost triangular planes of the tetrahedral element group of the elements a), c) and d) and the new nodal point, as shown in FIG. 12. Then, the new tetrahedral elements as illustrated by one-dotted line in FIG. 13 are established. However, in this case, due to contradiction in judgement that while the new nodal point is enclosed within the circumscribed sphere of the tetrahedral element a), it is not enclosed within the circumscribed sphere of the tetrahedral element b) despite of the fact that the new nodal point is added on the intersecting point of the circumscribed spheres of the tetrahedral elements a) and b), quite flat tetrahedral element is established with one of the outermost triangular plane (hatched triangle) and the new nodal point. As a result, the circumscribed sphere of such tetrahedral element becomes quite large to enclose peaks of other tetrahedral elements. Therefore, the condition of the Delaunay division that no peak of other tetrahedral elements is enclosed in the circumscribed sphere of the tetrahedral element is destroyed.

As set forth above, the current is defined on the edge of the tetrahedral element and the section of the current path is expressed with the surface connecting the circumcenters of tetrahedral element group having a predetermined edge in common. Therefore, failure of Delaunay division makes definition of the section of the current path impossible.

SUMMARY OF THE INVENTION

It is the first object of the present invention to provide a method for dividing an analyzing region while avoiding erroneous establishment of flat tetrahedral element due to numerical error to cause failure of Delaunay division in simulation.

The second object of the invention is to provide an analyzing region dividing system for implementing the analyzing region dividing method.

In accordance with the present invention, in order to divide an analyzing region in a semiconductor device into a plurality of fractional elements of a predetermined configuration, the analyzing region is initially divided into an arbitrary number of the fractional elements. With respect to a newly added nodal point, the fractional elements enclosing the new nodal point within a circumscribing range thereof are extracted as objective fractional elements for further division. Among the extracted fractional elements, specific fractional element having the perimetric fraction located within a predetermined modifying the perimeter of the fractional element group consist of the extracted fractional elements. The fractional elements are re-established on the basis of the modified perimeter and the new nodal point.

According to one aspect of the invention, a method for dividing an analyzing region in a semiconductor device into a plurality of fractional elements of a predetermined configuration, comprises the steps of:

initially dividing the analyzing region into an arbitrary number of the fractional elements;

adding a new nodal point at a position within the analyzing region;

extracting the fractional elements enclosing the new nodal point within a circumscribing range thereof as objective fractional elements for further division and forming a fractional element group having a closed perimeter consisting of perimetric fractions of the objective fractional elements located at outermost positions within the fractional element group;

extracting specific fractional element having the perimetric fraction located within a predetermined distance range to the new nodal point;

modifying the perimeter of the fractional element group on the basis of the result of extraction of the specific fractional element; and re-establishing the fractional elements in the fractional element group on the basis of the modified perimeter and the new nodal point.

According to another aspect of the invention, a system for dividing an analyzing region in a semiconductor device into a plurality of fractional elements of a predetermined configuration, comprises:

first means for initially dividing the analyzing region into an arbitrary number of the fractional elements;

second means for adding a new nodal point at a position within the analyzing region;

third means for extracting the fractional elements enclosing the new nodal point within a circumscribing range thereof as objective fractional elements for further division and forming a fractional element group having a closed perimeter consisted of perimetric fractions of the objective fractional elements located at outermost positions within the fractional element group;

fourth means for extracting specific fractional element having the perimetric fraction located within a predetermined distance range to the new nodal point;

fifth means for modifying the perimeter of the fractional element group on the basis of the result of extraction of the specific fractional element; and sixth means for re-establishing the fractional elements in the fractional element group on the basis of the modified perimeter and the new nodal point.

The fifth means may modify the perimeter by excluding the fractional element having the specific fractional element from the fractional element group. In the alternative, the fifth means may modify the perimeter by including additional fractional element interfacing with the specific fractional element at the perimetric fraction located within a predetermined distance range to the new nodal point.

In practice, the system may be employed in a computer based device simulator for a semiconductor device, and the predetermined distance range is established on the basis of tolerance in calculation with finite number of digits of the computer.

Preferably, the fractional elements are established by Delaunay division. The fractional element may be of tetrahedral configuration having triangular planes respectively forming the perimetric fraction. Then, the circumscribed range is defined by a circumscribed sphere of the tetrahedral fractional element.

In the preferred construction, the third means comprises:

means for extracting all of the fractional elements enclosing the new nodal point within a circumscribing range thereof and registering all of the extracted fractional elements in a first list; and means for extracting the fractional elements having perimetric fractions lying on the perimeter of the fractional element group as outermost fractional elements and registering the outermost fractional elements in a second list.

In such case, the first list may contain information concerning interfacing fractional elements with respect to each fractional element registered therein. The first list may further store the information of the interfacing fractional elements in association with identification of the relevant perimetric fractions.

The third means may comprise:

means for generating adjacent element information for fractional elements established by initial division;

means for retrieving one fractional element having a circumscribed range enclosing the new nodal point as a starting fractional element;

means for retrieving additional fractional elements adjacent the starting fractional element and having the circumscribed range enclosing the new nodal point for establishing a fractional element group of the retrieved fractional elements.

Other objects, features and advantages of the present invention will become apparent from the detailed description given hereinafter.

BRIEF DESCRIPTION OF THE DRAWING

The present invention will be understood more fully from the detailed description given herebelow and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessarily obscure the present invention.

Figure 1:
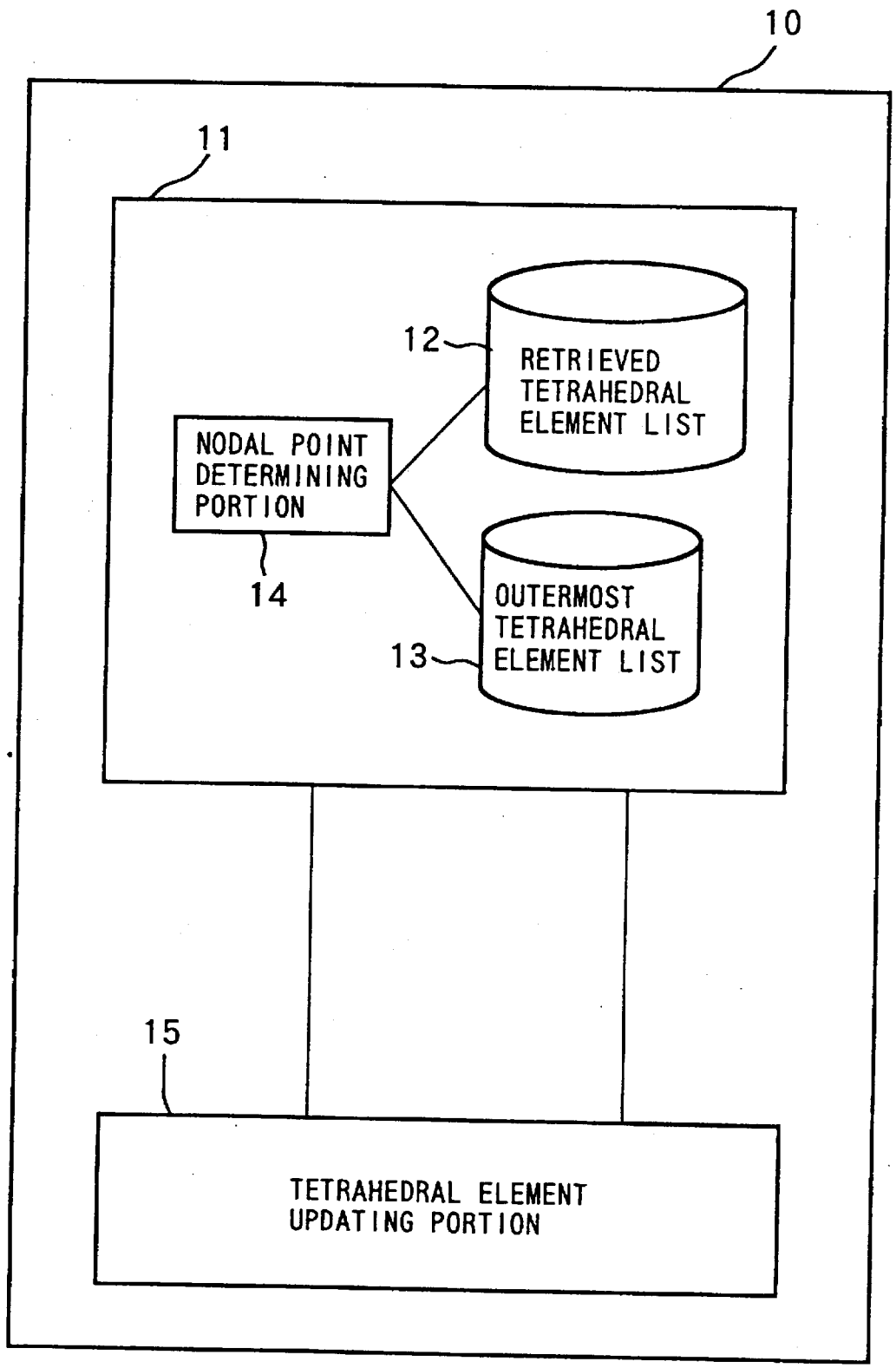
FIG. 1 is a block diagram showing the preferred embodiment of an analyzing region dividing system according to the present invention.

FIG. 1 is a block diagram showing a construction of the preferred embodiment of an analyzing region dividing system according to the present invention.

As shown, the shown embodiment of the analyzing region dividing system 10 includes a tetrahedral element retrieving portion 11 for retrieving predetermined tetrahedral elements to be further divided in a tetrahedral element group dividing a semiconductor into a plurality of fractional regions, and a tetrahedral element updating portion 15 for performing Delaunay division for further dividing the predetermined tetrahedral elements on the basis of the results of retrieval by the tetrahedral element retrieving portion 11.

The tetrahedral element retrieving portion 11 includes a retrieved tetrahedral element list 12 registering predetermined tetrahedral elements extracted from the tetrahedral element group formed in the analyzing region of the semiconductor device, an outermost tetrahedral element list 13 and a nodal point position determining portion 14 for determining positional relationship between the tetrahedral elements registered in the retrieved tetrahedral element list 12 and a new nodal point.

The retrieved tetrahedral element list 12 registers the tetrahedral elements to be further divided by Delaunay division. Namely, the retrieved tetrahedral element list 12 registers the tetrahedral elements having circumscribed spheres enclosing the new nodal point.

The outermost tetrahedral element list 13 registers the tetrahedral elements having outermost perimetric planes among the tetrahedral elements registered in the retrieved tetrahedral element list 12. Here, the wording "outermost perimetric plane" represents the plane located at the boundary or perimeter of the tetrahedral element group consisting of the retrieved tetrahedral elements 12. Therefore, the outermost perimetric planes are located at the boundary between the tetrahedral elements having the circumscribed spheres enclosing the new nodal point and the tetrahedral elements having the circumscribed spheres not enclosing the new nodal point.

The nodal point position determining portion 14 determines the positional relationship between the tetrahedral elements registered in the outermost tetrahedral element list 13 and the new nodal point. The nodal point position determining portion 14 also operates to add and delete the tetrahedral element to and from the retrieved tetrahedral element list 12 and the outermost tetrahedral element list 13.

The tetrahedral element updating portion 15 updates the tetrahedral element group of the retrieved tetrahedral elements to establish further divided new tetrahedral element group on the basis of the results of retrieval performed by the tetrahedral element retrieving portion 11.

Figure 2:
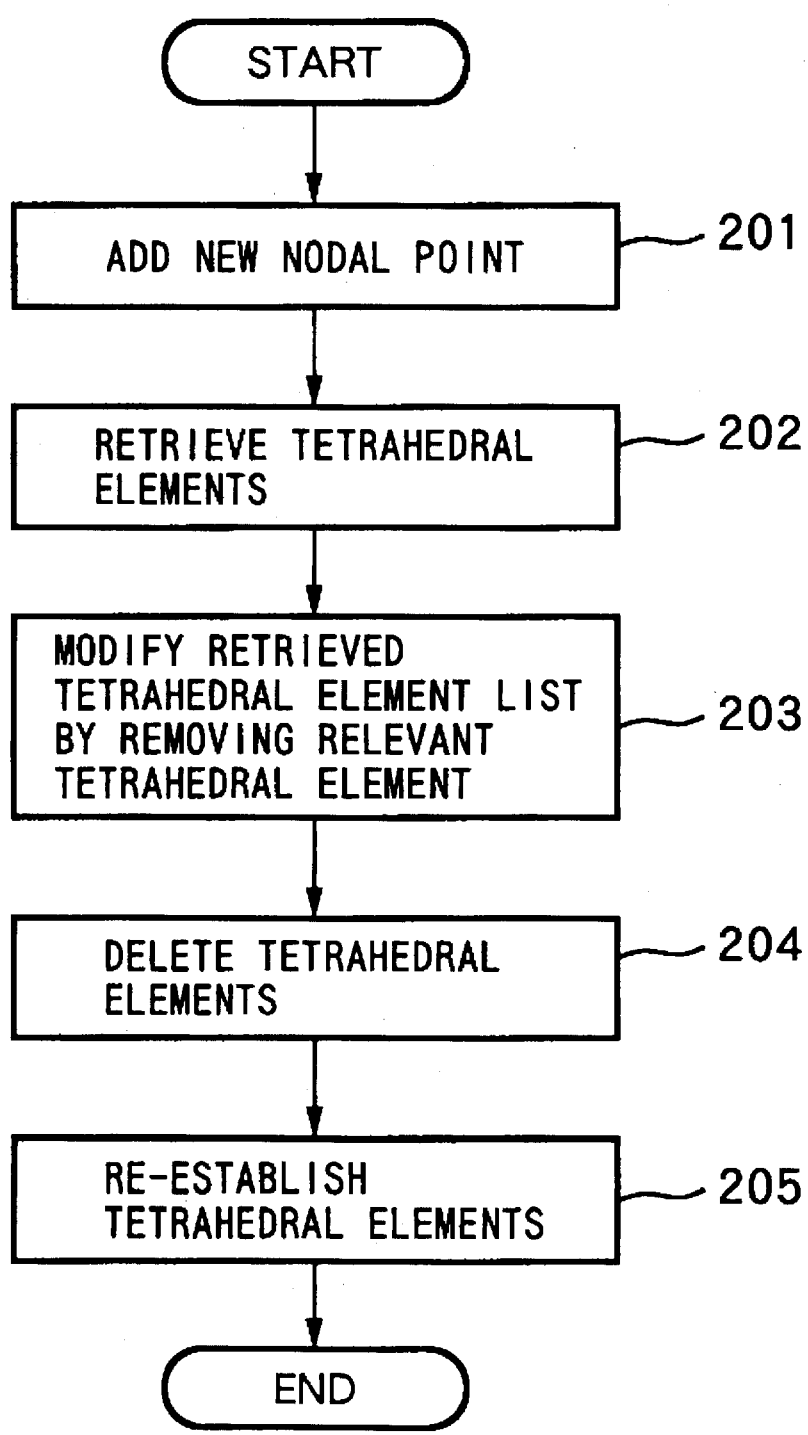
FIG. 2 is a flowchart showing the process in the first embodiment of an analyzing region dividing method according to the invention.

FIG. 2 is a flowchart showing the first embodiment of an analyzing region dividing method according to the present invention. It should be noted that the shown embodiment of the analyzing region dividing method may be implemented by a device simulator for a semiconductor device.

In the shown embodiment, the semiconductor device as an object for analysis is initially divided by Delaunay division. This initial Delaunay division may be performed by inputting external command and so forth. In the initial Delaunay division, an analyzing region of the semiconductor device is divided into a reasonable number of tetrahedral fractional regions which are referred to as "tetrahedral element". Since the initial Delaunay division is merely preparatory process for optimal Delaunay division to be performed by the shown embodiment, it is not necessary to perform division with taking physical structure of the semiconductor device.

In the shown embodiment, at first, a necessary new nodal point is added to a predetermined position within the analyzing region (step 201). Necessity of addition of the new nodal point is primarily caused:

(1) when nodal points are added for clearly defining the boundary of the material;

(2) when the nodal point is added for solving crossing between the tetrahedral and the boundary of material included in the analyzing region for the purpose of improvement of precision of analysis;

(3) when the nodal point is added for deleting tetrahedral having a circumcenter located out of the boundary of the material for the purpose of improvement of precision of analysis; and (4) when the circumcenter of the tetrahedral is set as new nodal point for further dividing tetrahedral having large circumscribed sphere into tetrahedrals having smaller circumscribed spheres for the purpose of improvement of precision of analysis.

The position to add the nodal point is preliminarily fixed depending upon the physical structure of the semiconductor device in the case of (1). In the case of (2) and (3), the position of the nodal point is appropriately determined depending upon the physical boundary point and the current dividing condition. In the case of (4), the position of the nodal point is determined in straightforward at the position of the circumcenter of the tetrahedral element to be divided. It should be noted that the addition of the new nodal point may be performed by external command input by an operation or so forth.

Next, by the tetrahedral element retrieving portion 11, the tetrahedral elements having the circumscribed spheres enclosing the newly added nodal point is retrieved and registered in the retrieved tetrahedral element list 12 (step 202). Retrieval of the tetrahedral element may be performed by checking whether the circumscribed sphere encloses the new nodal point with respect to each of all tetrahedral elements. Also, it may be possible to restrict objective tetrahedral elements to check whether the circumscribed spheres enclose the new nodal point or not. One of the ways to permit checking of the limited number of tetrahedral elements for extracting all tetrahedral elements having the circumscribed spheres enclosing the new nodal point has been disclosed in the commonly owned co-pending U.S. Patent Application (Serial No. is not yet known) filed on the same date with claiming convention priority based on Japanese Patent Application No. 5-230627, entitled "METHOD AND SYSTEM FOR DIVIDING ANALYZING REGION IN DEVICE SIMULATOR". The disclosure of the above-identified co-pending U.S. Patent Application is herein incorporated by reference.

Next, when there is the outermost perimetric plane having a distance to the new nodal point less than or equal to a predetermined judgment reference distance, the tetrahedral element having such outermost perimetric plane is removed from the retrieved tetrahedral element list 12 (step 203). This operation will be discussed in further detail.

Subsequently, the tetrahedral elements thus registered in the retrieved tetrahedral element list 12 are deleted from the analyzing region (step 204). Then, for the region where the tetrahedral elements are deleted, new tetrahedral elements are established with taking respective outermost perimetric planes as bottom and the new nodal point as peak (step 205).

Figure 3:
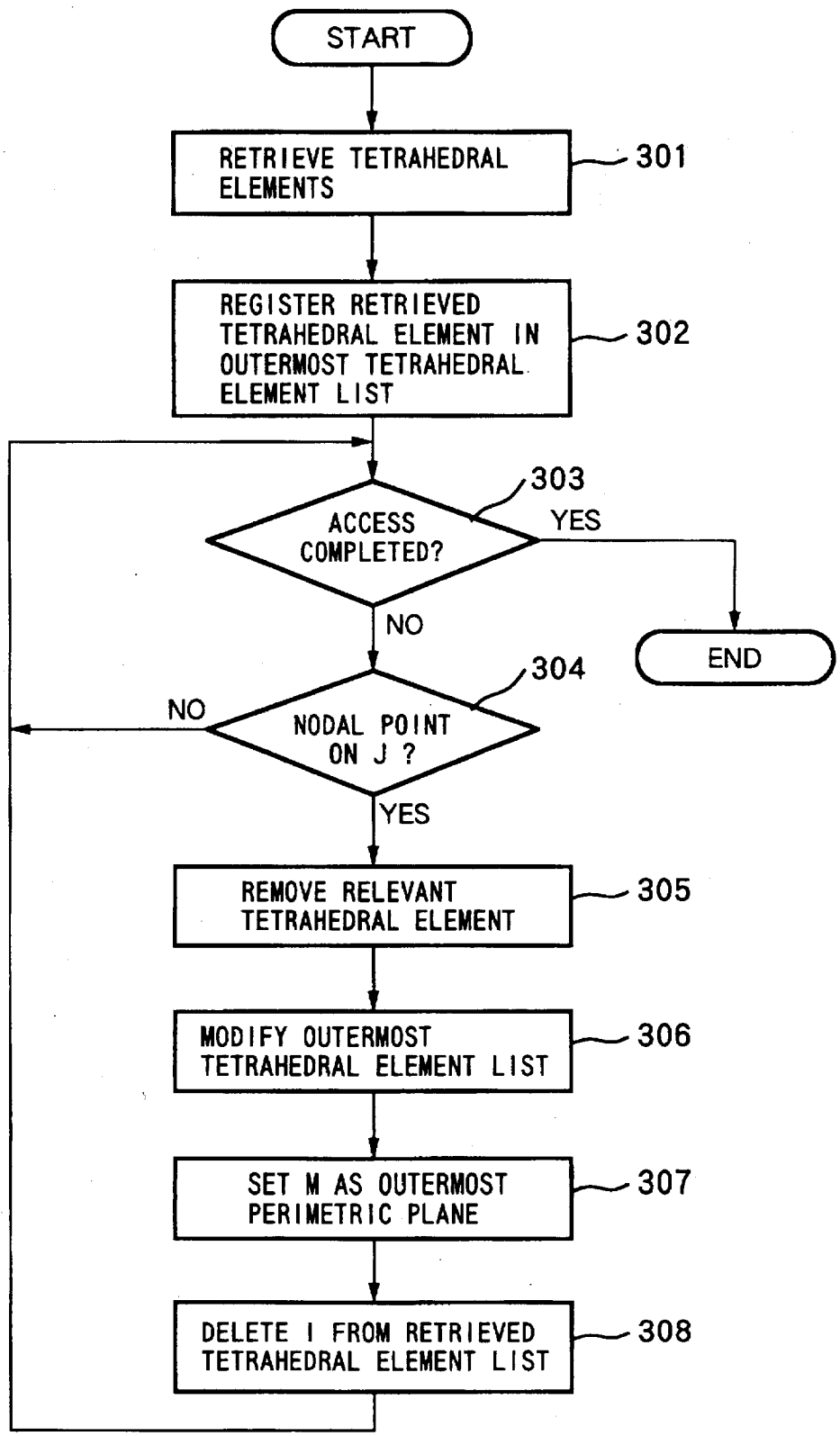
FIG. 3 is a flowchart showing further detail of the operation of FIG. 2.

FIG. 3 is a flowchart showing detail of the process in the step 203 by the tetrahedral element retrieving portion 11.

At first, all of the tetrahedral elements having the circumscribed spheres enclosing the new nodal point are retrieved (step 301). The retrieved tetrahedral elements are then registered in the retrieved tetrahedral element list 12. Subsequently, among the tetrahedral elements registered in the retrieved tetrahedral element list 12, tetrahedral elements having the outermost perimetric planes are retrieved. The tetrahedral elements having the outermost perimetric planes of the retrieved tetrahedral element group are registered in the outermost tetrahedral element list 13 (step 302). Then, the nodal point position determining portion 14 performs the following operation with respect to the tetrahedral elements registered in the outermost tetrahedral element list 13.

At first, check is performed whether all the tetrahedral elements registered in the outermost tetrahedral element list 13 are accessed (step 303). When any tetrahedral elements are not accessed at the step 303, check is performed whether new nodal point is present on a plane including arbitrary outermost perimetric plane J of the arbitrary tetrahedral element which is not accessed (step 304). Here, the passage "the new nodal point is present on a plane" does not necessarily mean the presence of the new nodal point exactly on the plane but does mean that the distance between the plane in question and the new nodal point is less than or equal to a given judgement reference distance. The judgement reference distance may be determined depending upon the desired precision level (effective digit number or so forth) in calculation in the analyzing region dividing system for implementing the shown embodiment.

When the new nodal point is present on the outermost perimetric plane J, the tetrahedral element I having the outermost perimetric plane J is removed from the outermost tetrahedral element list 13 (step 305). Next, the tetrahedral element K interfacing with the tetrahedral element I at other than the outermost perimetric plane J and having the circumscribed sphere enclosing the new nodal point is added to the outermost tetrahedral element list 13 (step 306). Then, among four planes of the newly registered tetrahedral element K, the plane interfacing the tetrahedral element I is registered in the retrieved tetrahedral element list (step 307). Subsequently, the tetrahedral element I is removed from the retrieved tetrahedral element list 12 (step 308).

The foregoing process is repeatedly performed until all of the tetrahedral elements registered in the outermost tetrahedral element list 13 are processed (step 303).

Figure 4:
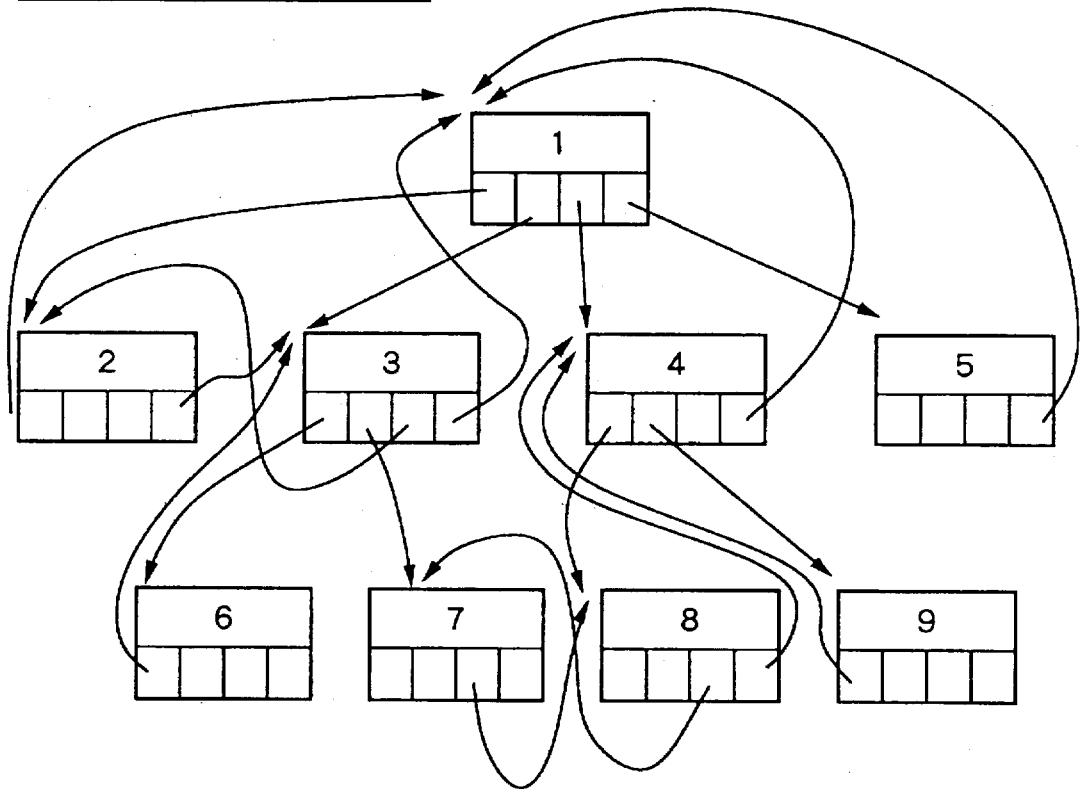
FIG. 4 is an illustration showing a data structure of a retrieval list.

FIG. 4 shows one example of a data structure in the retrieved tetrahedral element list 12 to be employed in the present invention. When adjacent tetrahedral element has the circumscribed sphere enclosing the new nodal point, a pointer indicative of the relevant tetrahedral element is provided in the retrieved tetrahedral element list 12. Namely, since the tetrahedral element has four planes and interfaces with adjacent tetrahedral elements at respective planes, with respect to each plane, a tetrahedral element number of the tetrahedral element interfacing at the relevant plane and having the circumscribed sphere enclosing the new nodal point is stored. When the adjacent tetrahedral element has the circumscribed sphere not enclosing the new nodal point, the pointer indicative of the adjacent tetrahedral element becomes void. In other words, the tetrahedral element having the void pointer becomes the tetrahedral element having the outermost perimetric plane. Then, the plane of the tetrahedral element having the void pointer becomes the outermost perimetric plane. It should be appreciated that in FIG. 4, correspondence of each of the pointers and the adjacent tetrahedral elements is illustrated by arrows.

Figure 5:
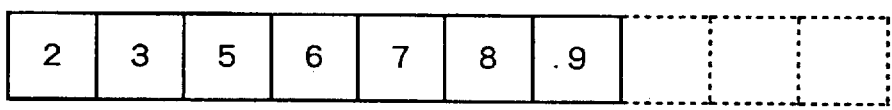
FIG. 5 is an illustration showing a data structure of outermost tetrahedral element list.

FIG. 5 shows the outermost tetrahedral element list 13. As set forth above, the outermost tetrahedral element list 13 stores the element number of tetrahedral elements having the outermost perimetric planes.

The concrete example illustrated in FIG. 5 will be discussed. As shown in FIG. 4, it is assumed that the tetrahedral elements having element numbers 1 to 9 enclose the new nodal point within the circumscribed spheres. The tetrahedral element 1 interfaces with the tetrahedral elements 2, 3, 4 and 5. Namely, the tetrahedral element 1 has pointers with respect to all planes and thus is not the outermost tetrahedral element. On the other hand, the tetrahedral element 2 interfaces with the tetrahedral element 1 at the plane 1 and with the tetrahedral element 3 at the plane 4. However, the tetrahedral element 2 has no pointer indicating the tetrahedral elements interfacing with the planes 2 and 3. Namely, the tetrahedral element 2 is the tetrahedral element having the outermost perimetric planes, and the planes 2 and 3 form the outermost perimetric planes. In the manner set forth above, the tetrahedral elements having the outermost perimetric planes are extracted and stored in the outermost tetrahedral element list 13. In the shown example, the tetrahedral elements 2, 4, 5, 6, 7, 8, 9 have the outermost perimetric planes.

Here, consideration is given in the case where the new nodal point is present on the plane including one of the outermost perimetric plane of the tetrahedral element 6. In such case, at first, at the step 305 of FIG. 3, the tetrahedral element 6 is removed from the outermost tetrahedral element list 13. Then, at the step 306, the tetrahedral element 3 interfacing with the tetrahedral element 6 at the plane other than the outermost perimetric plane is newly registered in the outermost tetrahedral element list as the tetrahedral element having the outermost perimetric plane. Then, at the step 307, among four planes of the newly registered tetrahedral element 3, the plane 1 interfacing with the tetrahedral element 6 is registered as the outermost perimetric plane. Furthermore, at the step 308, the tetrahedral element 6 is deleted from the retrieved tetrahedral element list 12.

Figure 8:
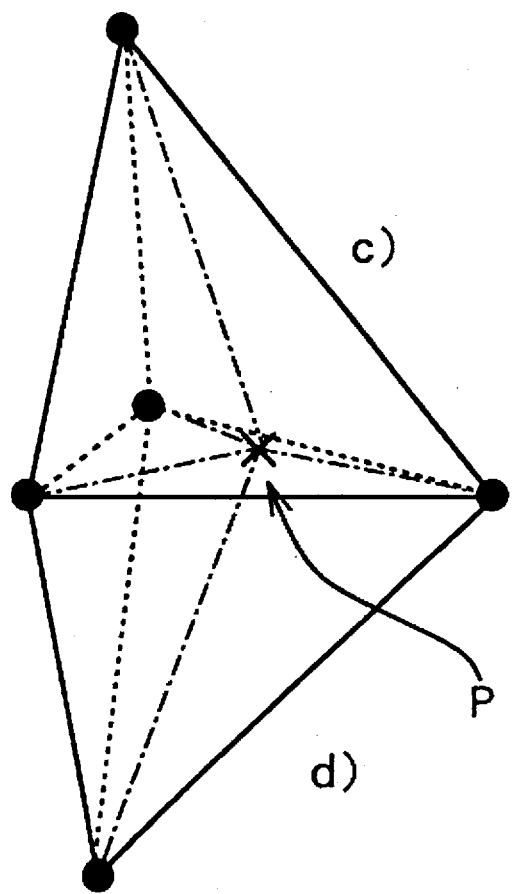
FIG. 8 is an illustration showing a result of dividing process by the first embodiment.
Figure 12:
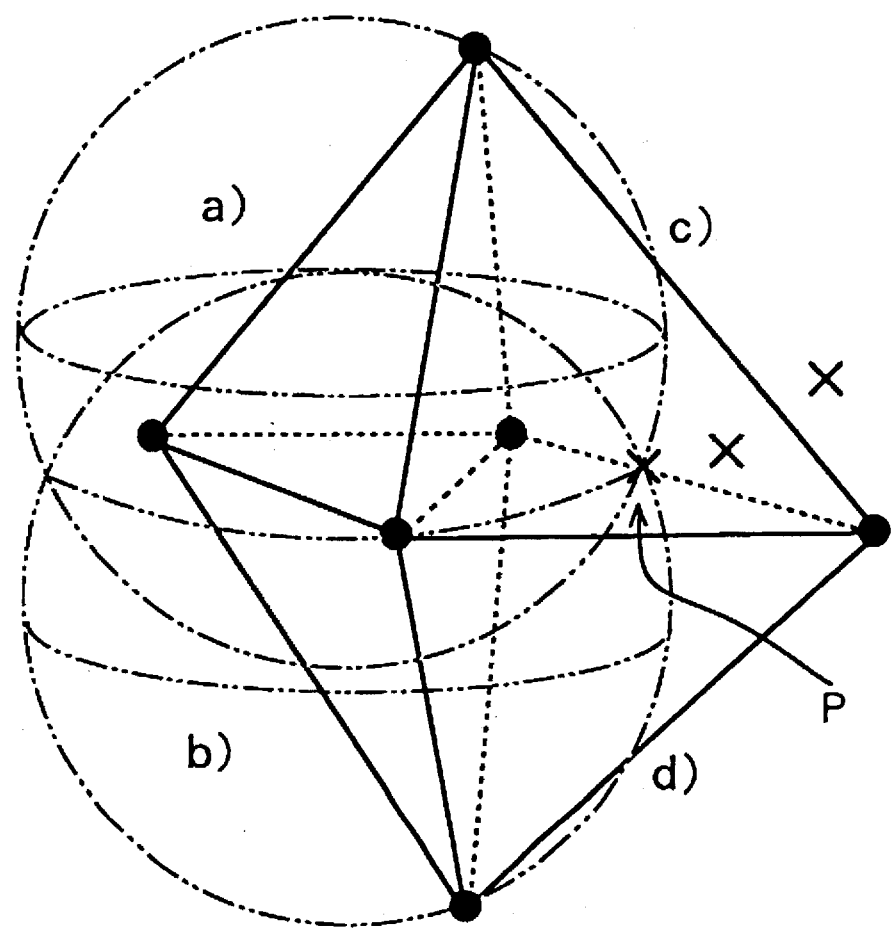
FIG. 12 is an illustration showing an example for adding new nodal point for Delaunay divided four tetrahedral elements.
Figure 13:
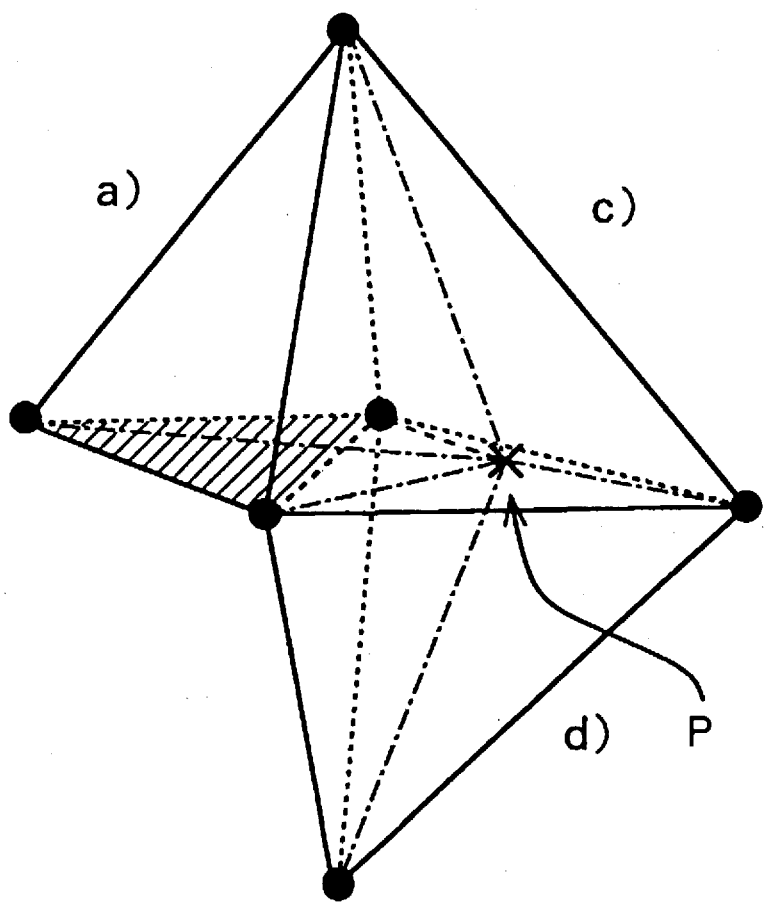
FIG. 13 is an illustration showing a condition where failure is caused in Delaunay division due to numerical error when the conventional method is employed.
Figure 14:
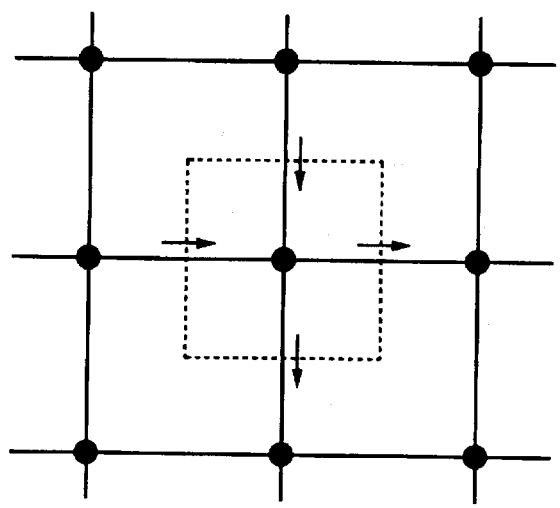
FIG. 14 is an illustration showing a current and its integrating region in an orthogonal grid.
Figure 15:
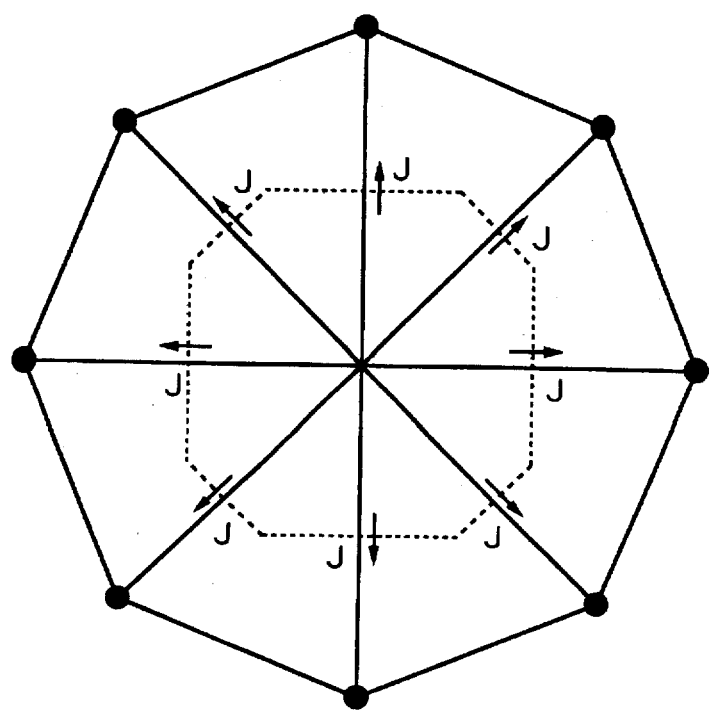
FIG. 15 is an illustration showing a current and its integrating region in a triangular grid.

The operation of the shown embodiment as set forth above will be further discussed concretely with reference to FIGS. 8, 12 and 13.

FIG. 12 shows the condition where new nodal point P is added to the analyzing region consisted of Delaunay divided four tetrahedral elements a), b), c) and d). The new nodal point P is assumed to be positioned on the intersecting plane of circumscribed spheres of the tetrahedral elements a) and b).

Then, through the step 202 of FIG. 2, check is performed whether the new nodal point P is enclosed in respective circumscribed spheres. In the example of FIG. 12, it is found that tetrahedral elements a), c) and d) have the circumscribed spheres enclosing the new nodal point P. Here, since the new nodal point is located on the intersecting plane of the circumscribed spheres of the tetrahedral elements a) and b), the tetrahedral element b) should also be included in the retrieved tetrahedral element list 12. However, in the shown example, as set forth above, the tetrahedral element b) is judged such that the circumscribed sphere thereof does not enclose the new nodal point due to error in calculation.

Next, at the step 203 of FIG. 2, the distance between the outermost perimetric planes of the tetrahedral elements a), c) and d) and the new nodal point is checked with respect to the judgement reference distance. When the distance is smaller than or equal to the judgement reference distance, the judgement is made that the new nodal point is present on the plane in question. Then, the tetrahedral element having such plane is removed from the retrieved tetrahedral element list. In the shown case, since the new nodal point P is located on the outermost perimetric plane indicated by hatched triangle on the tetrahedral element a), the tetrahedral element a) is removed from the retrieved tetrahedral element list. By this, the new nodal point is not located on the outermost perimetric surface of the tetrahedral elements remained in the retrieved tetrahedral element list.

Here, the judgement reference distance for the distance between the plane to be judged and the new nodal point for checking whether the new nodal point is located on the outermost perimetric plane of the tetrahedral element in question has to be greater or equal to the judgement reference distance for making judgement whether the new nodal point is enclosed in the circumscribed sphere of the tetrahedral element.

Figure 10:
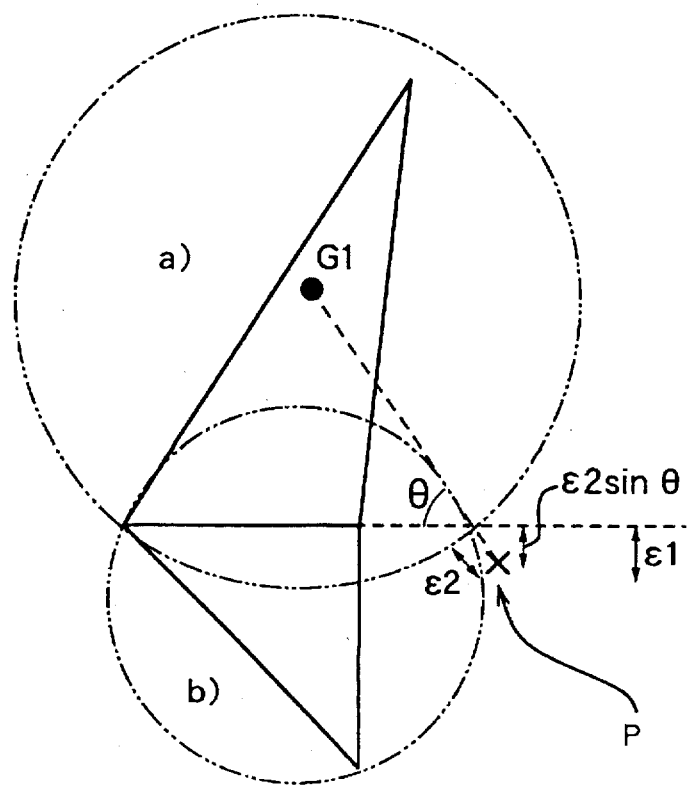
FIG. 10 is an illustration showing a judgement reference distance.
Figure 11:
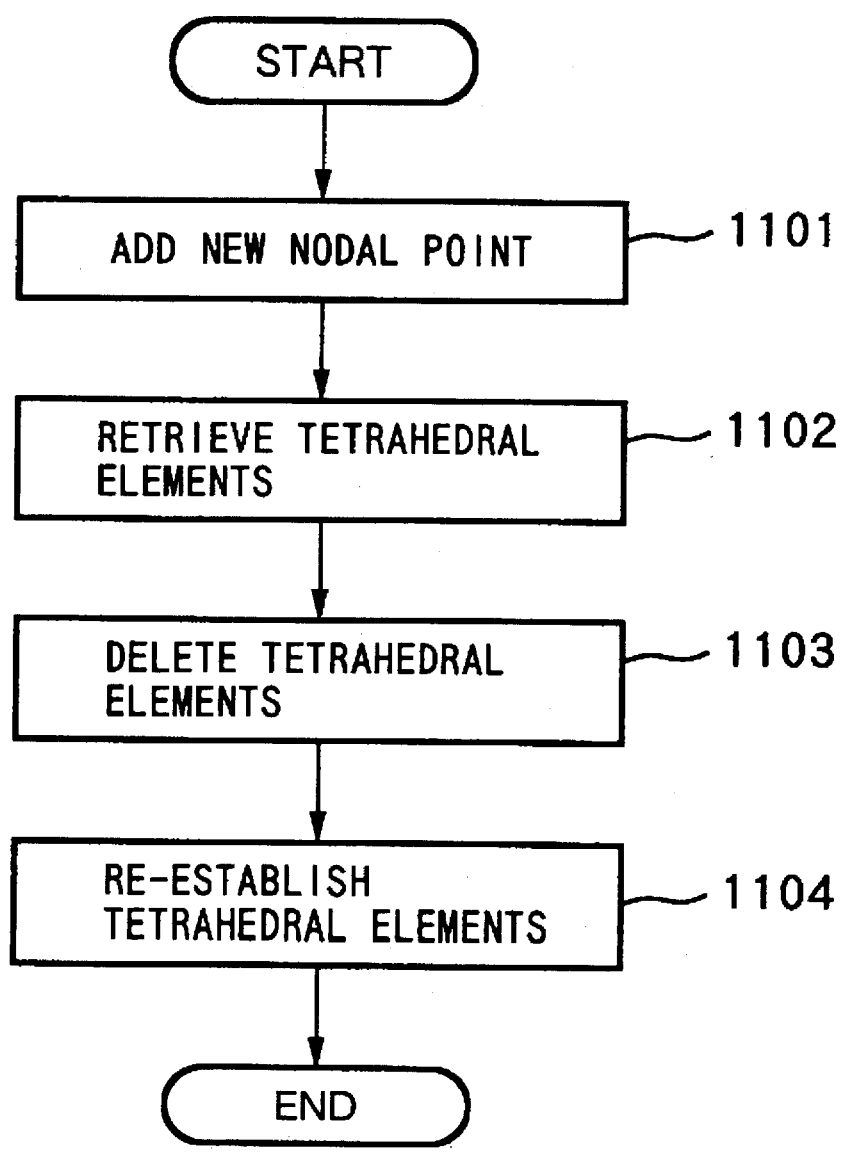
FIG. 11 is a flowchart showing a conventional method for Delaunay division.

Here, discussion will be given for the corresponding sections of the tetrahedral elements a) and b) of FIG. 12 with reference to FIG. 10. In FIG. 10, erroneous judgement due to error in calculation in judgement whether the circumscribed sphere encloses the new nodal point P is possibly caused when the new nodal point is located at a distance less than or equal to $\epsilon_2$. Accordingly, assuming that an angle defined by a line extending through circumcenter and the new nodal point and a common triangular plane of the tetrahedral elements a) and b) is θ, the erroneous judgement can be caused when the distance between the new nodal point P and the common triangular plane of the tetrahedral elements a) and b) is less than or equal to $\epsilon_2 \cdot \sin(\theta)$. For detecting the nodal point at the distance $\epsilon_2 \cdot \sin(\theta)$, the judgement reference distance $\epsilon_1$ for making judgement whether the new nodal point P is located on the plane including the outermost perimetric plane, has to be greater than or equal to $\epsilon_2 \cdot \sin(\theta)$. Therefore, since $\sin(\theta)$ is always less than or equal to 1, the distances may be set at $\epsilon_1 = \epsilon_2$.

Next, at the step 204 of FIG. 2, the tetrahedral elements c) and d) are deleted from the analyzing region formed by the tetrahedral element group registered in the retrieved tetrahedral element list. Then, at the step 205 of FIG. 2, the new tetrahedral elements are established with taking the outermost perimetric planes of the deleted tetrahedral element group as the bottom plane and the new nodal point as the peak.

As a result, as shown in FIG. 8, the initially presented tetrahedral elements c) and d) are divided into six tetrahedral elements by adding the new nodal point P. It should be appreciated that while it is not illustrated in FIG. 8, the tetrahedral elements a) and b) are maintained as they are without division.

Next, operation for deleting the tetrahedral element a) will be concretely discussed with reference to FIGS. 12 and 13.

At first, at step 301, the tetrahedral elements having the circumscribed spheres enclosing the new nodal point P are retrieved. In the example of FIG. 12, out of four tetrahedral elements a), b), c) and d), three tetrahedral elements a), c) and d) are retrieved, as set forth above.

Then, in the shown example, since all of the tetrahedral elements a), c) and d) have the outermost perimetric planes, all of the tetrahedral elements a), c) and d) are registered in the outermost tetrahedral element list at the step 303 of FIG. 3.

With respect to the tetrahedral elements a), c) and d) registered in the outermost tetrahedral element list, the processes of the steps 304 to 308 are repeated. Hereinafter, the processes through the steps 304 to 308 will be discussed in terms of the tetrahedral element a).

As shown in FIG. 13, while the tetrahedral element a) has three outermost perimetric planes, the new nodal point P is located on the plane indicated by the hatched area. Accordingly, through the processes of the steps 303 to 305, the tetrahedral element a) is removed from the outermost tetrahedral element list.

Then, at the step 306, the tetrahedral element c) interfacing with the tetrahedral element a) at the plane other than the outermost planes and having the circumscribed sphere enclosing the new nodal point P is registered in the outermost tetrahedral element list, It should be noted that, in the shown example, since the tetrahedral element c) has already been registered, redundant registration will not be made.

At the step 307, the triangular plane at the interface between the tetrahedral elements a) and c) is defined as new outermost perimetric plane. Thereafter the tetrahedral element a) is deleted from the retrieved tetrahedral element list.

As set forth above, by the shown embodiment, the flat tetrahedral element which may cause failure of the Delaunay division will not be established.

Figure 6:
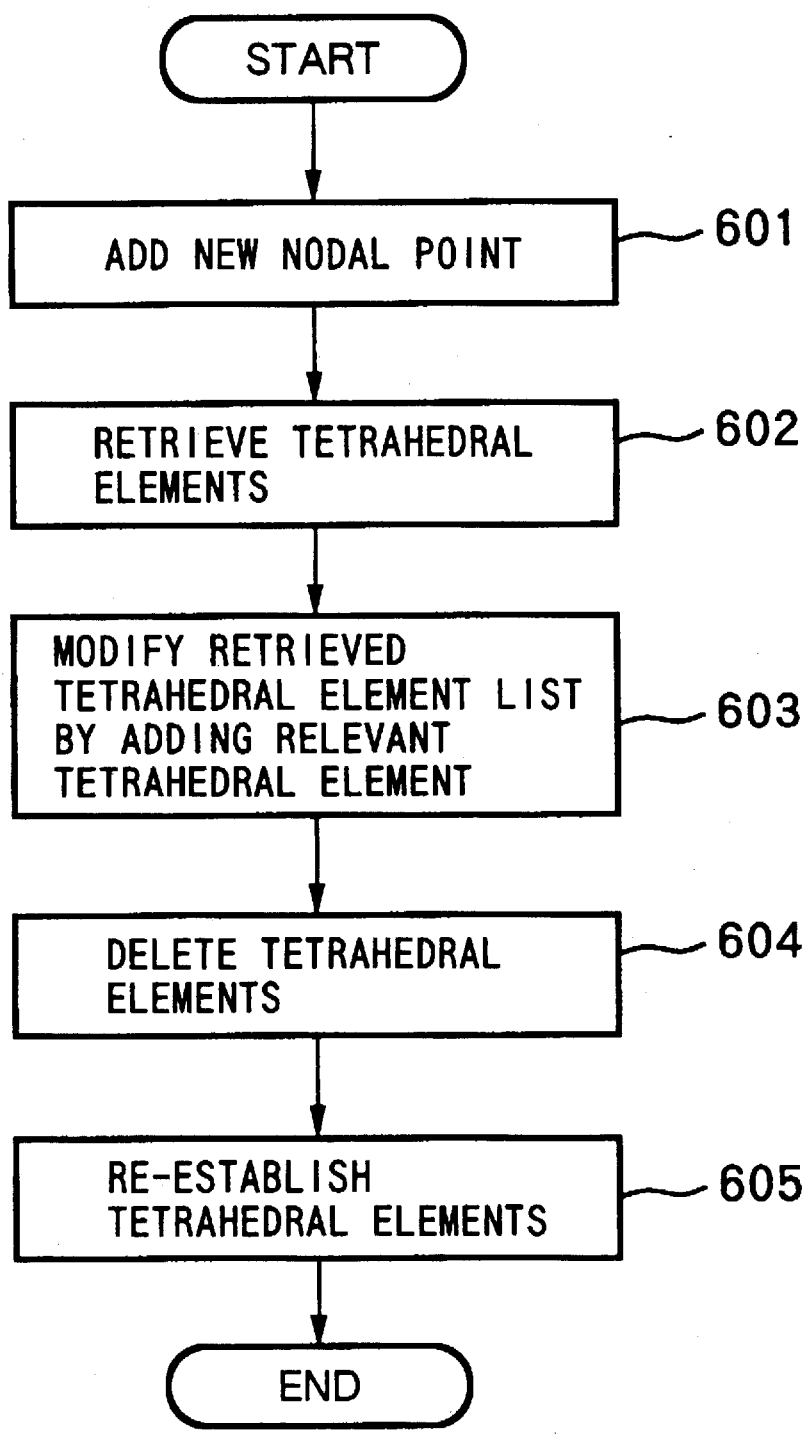
FIG. 6 is a flowchart showing the process in the first embodiment of an analyzing region dividing method according to the invention.

FIG. 6 is a flowchart showing the second embodiment of the analyzing region dividing method according to the present invention. Since the operations for adding a necessary new nodal point to a predetermined position within the analyzing region (step 601) and the operation for registering the tetrahedral elements having the circumscribed spheres enclosing the new nodal point in the retrieved tetrahedral element list (step 602) are the same as those of the steps 201 and 202 in the first embodiment, detailed discussion for these steps is neglected in order to keep the disclosure simple enough to facilitate clear understanding.

Next, when there is the outermost perimetric plane having a distance to the new nodal point less than or equal to a predetermined judgement reference distance, the tetrahedral element interfacing with such outermost perimetric plane is added to the retrieved tetrahedral element list 12 (step 603). This operation will be discussed in further detail.

Subsequently, the tetrahedral elements thus registered in the retrieved tetrahedral element list 12 are deleted from the analyzing region (step 604). Then, for the region where the tetrahedral elements are deleted, new tetrahedral elements are established with taking respective outermost perimetric planes as bottom and the new nodal point as peak (step 605).

Figure 7:
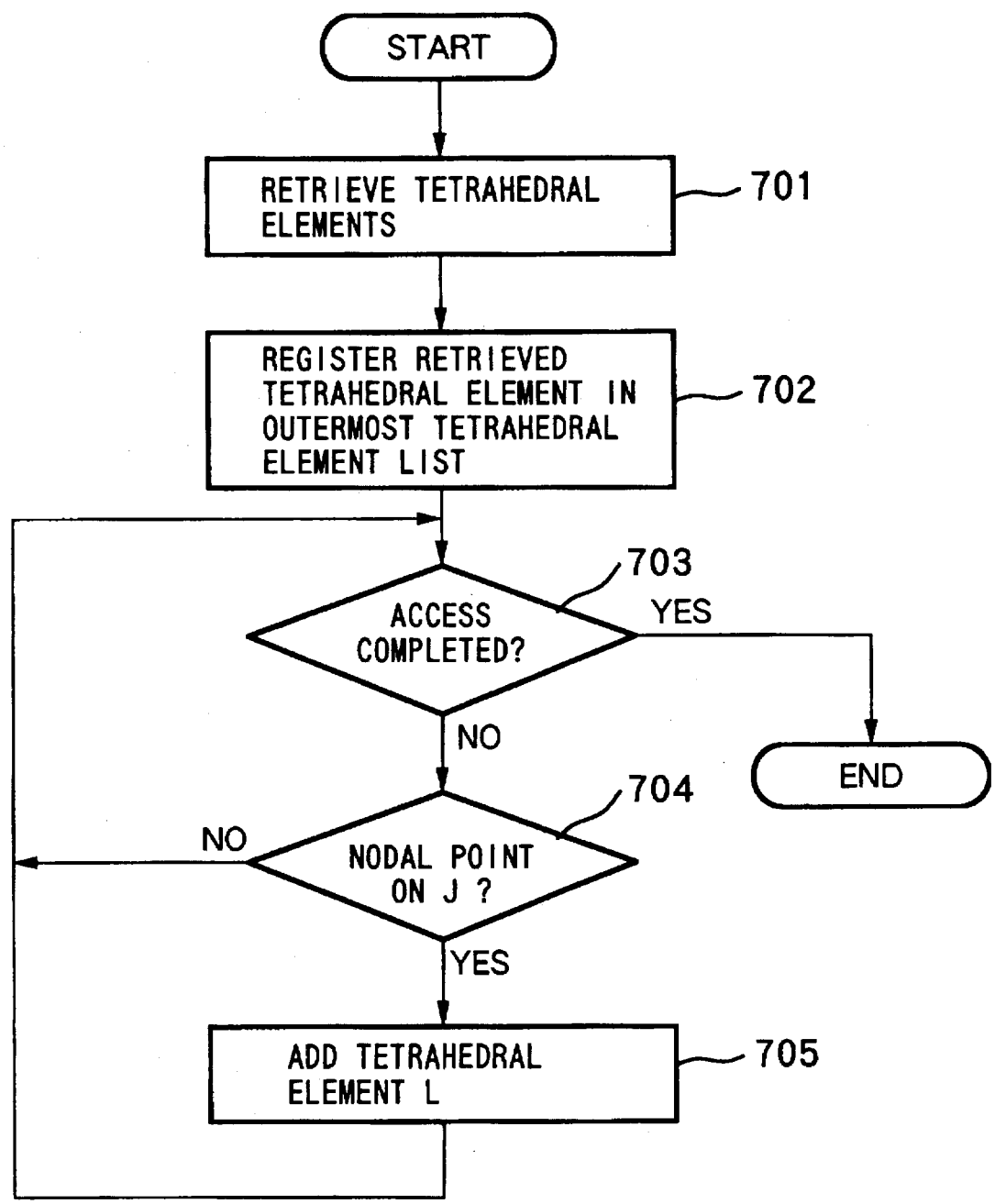
FIG. 7 is a flowchart showing further detail of the operation of FIG. 6.

FIG. 7 is a flowchart showing detail of the process in the step 603 by the tetrahedral element retrieving portion 11.

At first, all of the tetrahedral elements having the circumscribed spheres enclosing the new nodal point are retrieved (step 701). The retrieved tetrahedral elements are then registered in the retrieved tetrahedral element list 12. Subsequently, among the tetrahedral elements registered in the retrieved tetrahedral element list 12, tetrahedral elements having the outermost perimetric planes are retrieved. The tetrahedral elements having the outermost perimetric planes of the retrieved tetrahedral element group are registered in the outermost tetrahedral element list 13 (step 702). Then, the nodal point position determining portion 14 performs the following operation with respect to the tetrahedral elements registered in the outermost tetrahedral element list 13.

At first, check is performed whether the all tetrahedral elements registered in the outermost tetrahedral element list 13 are accessed (step 703). When any tetrahedral elements are not accessed at the step 303, check is performed whether new nodal point is present on a plane including arbitrary outermost perimetric plane J of the arbitrary tetrahedral element which is not accessed (step 704).

When the new nodal point is present on the outermost perimetric plane J, the tetrahedral element L interfacing with the tetrahedral element I at the outermost perimetric plane J is registered in the outermost tetrahedral element list 13 (step 705). By this, the tetrahedral element L which is judged that its circumscribed sphere does not enclose the new nodal point at the step 701, is taken care of as that enclosing the new nodal point within its circumscribed sphere. The foregoing processes are repeatedly performed until all of the tetrahedral elements registered in the outermost tetrahedral element list are processed (step 703).

Figure 9:
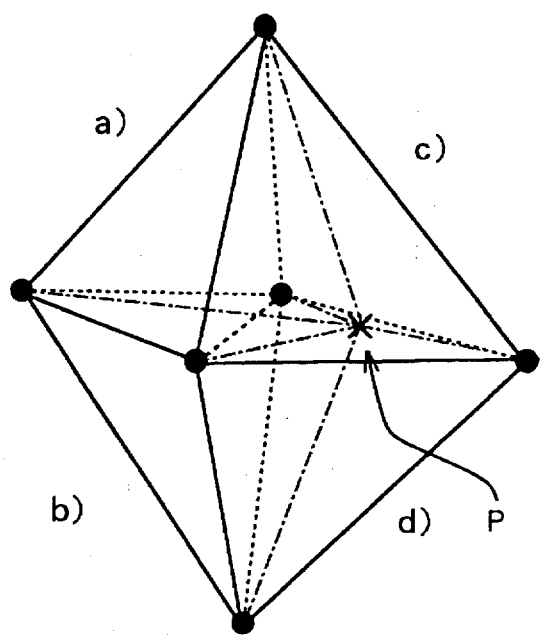
FIG. 9 is an illustration showing a result of dividing process by the second embodiment.

One example of the result of division performed through the foregoing process is illustrated in FIG. 9. FIG. 9 shows the condition where new tetrahedral elements are established by adding the new nodal point P for the Delaunay divided tetrahedral element group illustrated in FIG. 12. Here, while the tetrahedral element b) is judged that the circumscribed sphere thereof does not enclose the new nodal point, the objective region is established while including the tetrahedral element b). Then, the objective region is divided into eight fractional tetrahedral elements. Therefore, establishing of the flat tetrahedral element which is otherwise caused as illustrated in FIG. 13, can be successfully prevented.

Here, similarly to the foregoing first embodiment, the judgment reference distance for the distance between the plane to be judged and the new nodal point for checking whether the new nodal point is located on the outermost perimetric plane of the tetrahedral element in question has to be greater or equal to the judgement reference distance for making judgement whether the new nodal point is enclosed in the circumscribed sphere of the tetrahedral element.

In the practical device simulation, even with the processing system having 16 digits of effective digits, since square calculation is required in calculating the distance between two coordinate positions, the effective digit number for making judgement whether the circumscribed sphere encloses the new nodal point, is decreased to be 8 digit. Namely, when the new nodal point is located at a distance within a range of (radius of circumscribed sphere$\times 10^{-8}$), there is a likelihood that error is caused in judgement whether the new nodal point is enclosed in the circumscribed sphere or not. Also, the current is defined on the edges of the tetrahedral element and the section of the current path is expressed by the plane connecting circumcenters of the tetrahedral elements having the edge in common. Therefore, when failure is caused in Delaunay division, it becomes impossible to define the section of the current path to make continuation of the calculation.

However, as set forth above, according to the present invention, since the tetrahedral element registered due to error in calculation can be removed from the objective tetrahedral element group, flat tetrahedral element which causes failure of Delaunay division, will not be established.

Conversely, according to the invention, since the tetrahedral element which is not registered due to error in calculation can be added in the objective tetrahedral element group, flat tetrahedral element which causes failure of Delaunay division, will not be established.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A method for dividing an analyzing region of a semiconductor device into a plurality of tetrahedral elements of a predetermined configuration, comprising the steps of:

(a) initially dividing said analyzing region into a plurality of tetrahedral elements;

(b) adding a new nodal point at a position within said analyzing region;

(c) retrieving from said plurality of tetrahedral elements each tetrahedral element having a circumscribed sphere enclosing said new nodal point by comparing a distance between a center of the circumscribed sphere and the new nodal point with a radius of the circumscribed sphere;

(d) among the retrieved tetrahedral elements, retrieving said tetrahedral elements having an outermost triangular plane at an outermost position as outermost tetrahedral elements;

(e) judging whether a distance between the outermost triangular plane of each of said outermost tetrahedral elements and said new nodal point is within a predetermined distance range;

(f) deleting said outermost tetrahedral elements having the outermost triangular plane from the retrieved outermost tetrahedral elements when said distance is within the predetermined distance range; and (g) establishing new tetrahedral elements by connecting said new nodal point with peaks of said retrieved tetrahedral elements excluding deleted tetrahedral elements.

2. A method as set forth in the claim 1, further comprising the step of:

(h) repeating the step (e) of judging whether said distance is within the predetermined distance range and the step (f) of deleting said tetrahedral elements having the outermost triangular plane, until all of the retrieved outermost tetrahedral elements are processed.

3. A method as set forth in claim 1, further comprising the step of:

(h) adding to the retrieved outermost tetrahedral elements a tetrahedral element which interfaces with said deleted tetrahedral element at a position other than the outermost triangular plane and which has a circumscribed sphere enclosing said new nodal point.

4. A method as set forth in claim 1, wherein steps (a) through (g) are implemented in a computer based device simulator for a semiconductor device, and wherein said predetermined distance range is established on a basis of tolerance associated with calculating with a finite number of digits of said computer.

5. A method as set forth in claim 1, wherein the step (a) of dividing includes establishing the tetrahedral elements by Delaunay division.

6. A method as set forth in claim 1, further comprising the steps of:

(h) registering all of the retrieved tetrahedral elements in a first list; and (i) registering all of the retrieved outermost tetrahedral elements in a second list;

wherein at the step (f) of deleting said tetrahedral elements having the outermost triangular plane from the retrieved outermost tetrahedral elements, said tetrahedral elements are deleted by removing said tetrahedral elements from said first and second lists, and wherein at the step (g) of establishing new tetrahedral elements, said new nodal point is connected with the peaks of said tetrahedral elements registered in said first list.

7. A method for dividing an analyzing region of a semiconductor device into a plurality of tetrahedral elements of a predetermined configuration, comprising the steps of:

(a) initially dividing said analyzing region into a plurality of tetrahedral elements;

(b) adding a new nodal point at a position within said analyzing region;

(c) retrieving from said plurality of said tetrahedral elements each tetrahedral element having a circumscribed sphere enclosing said new nodal point by comparing a distance between a center of the circumscribed sphere and the new nodal point with a radius of the circumscribed sphere;

(d) among the retrieved tetrahedral elements, retrieving said tetrahedral elements having an outermost triangular plane at an outermost position as outermost tetrahedral elements;

(e) judging whether the distance between the outermost triangular plane of each of said outermost tetrahedral elements and said new nodal point is within a predetermined distance range;

(f) when said distance is within the predetermined distance range, adding to the retrieved outermost tetrahedral elements new tetrahedral elements which interface with said tetrahedral elements having the outermost triangular plane of said tetrahedral elements; and (g) establishing new tetrahedral elements by connecting said new nodal point with peaks of said retrieved tetrahedral elements and said new tetrahedral elements.

8. A method as set forth in claim 7, further comprising the step of:

(h) repeating the step (e) of judging whether said distance is within the predetermined distance range and the step (f) of adding the new tetrahedral elements which interface with said tetrahedral elements having the outermost triangular plane, until all of the retrieved outermost tetrahedral elements are processed.

9. A method as set forth in claim 7, further comprising the steps of:

(h) registering all of the retrieved tetrahedral elements in a first list;

(i) registering all of the retrieved outermost tetrahedral elements in a second list;

wherein at the step (f) of adding new tetrahedral elements to the retrieved outermost tetrahedral elements, said new tetrahedral elements are added by registering said new tetrahedral elements in said first and second lists, and wherein at the step (g) of establishing new tetrahedral elements, said new nodal point is connected with the peaks of said tetrahedral elements registered in said first list.

10. A system for dividing an analyzing region of a semiconductor device into a plurality of tetrahedral elements of a predetermined configuration, comprising:

first means for initially dividing said analyzing region into a plurality of tetrahedral elements;

second means for adding a new nodal point at a position within said analyzing region;

third means for retrieving from said plurality of tetrahedral elements each tetrahedral element having a circumscribed sphere enclosing said new nodal point by comparing a distance between a center of the circumscribed sphere and the new nodal point with a radius of the circumscribed sphere;

fourth means for retrieving, among the retrieved tetrahedral elements, said tetrahedral elements having an outermost triangular plane at an outermost position as outermost tetrahedral elements;

fifth means for judging whether a distance between the outermost triangular plane of each of said outermost tetrahedral elements and said new nodal point is within a predetermined distance range;

sixth means for deleting said outermost tetrahedral elements having the outermost triangular plane from the retrieved outermost tetrahedral elements when said distance is within the predetermined distance range; and seventh means for establishing new tetrahedral elements by connecting said new nodal point with peaks of said retrieved tetrahedral elements excluding deleted tetrahedral elements.

11. A system as set forth in claim 10, further comprising:

means for repeating the fifth means for judging whether said distance is within the predetermined distance range and the sixth means for deleting said tetrahedral elements having the outermost triangular plane, until all of the retrieved outermost tetrahedral elements are processed.

12. A system as set forth in claim 10, further comprising:

means for adding to said outermost tetrahedral elements a tetrahedral element which interfaces with said deleted tetrahedral element at a position other than the outermost triangular plane and which has a circumscribed sphere enclosing said new nodal point.

13. A system as set forth in claim 10, wherein said first through seventh means are implemented in a computer based device simulator for a semiconductor device, and wherein said predetermined distance range is established on a basis of tolerance associated with calculating with finite number of digits of said computer.

14. A system as set forth in claim 10, wherein said first means for dividing includes means for establishing the tetrahedral elements by Delaunay division.

15. A system as set forth in claim 10, further comprising:

means for registering all of the retrieved tetrahedral elements in a first list;

means for registering all of the retrieved outermost tetrahedral elements in a second list;

wherein said sixth means deletes said tetrahedral elements by removing said tetrahedral elements from said first and second lists, and wherein said seventh means connects said new nodal point with the peaks of said tetrahedral elements registered in said first list.

16. A system for dividing an analyzing region in a semiconductor device into a plurality of tetrahedral elements of a predetermined configuration, comprising:

first means for initially dividing said analyzing region into a plurality of tetrahedral elements;

second means for adding a new nodal point at a position within said analyzing region;

third means for retrieving from said plurality of tetrahedral elements each tetrahedral element having a circumscribed sphere enclosing said new nodal point by comparing a distance between a center of the circumscribed sphere and the new nodal point with a radius of the circumscribed sphere;

fourth means for retrieving, among the retrieved tetrahedral elements, said tetrahedral elements having an outermost triangular plane at an outermost position as outermost tetrahedral elements;

fifth means for judging whether a distance between the outermost triangular plane of each of said outermost tetrahedral elements and said new nodal point is within a predetermined distance range;

sixth means for adding to the retrieved outermost tetrahedral elements, when said distance is within the predetermined distance range, new tetrahedral elements which interface with said tetrahedral elements having the outermost triangular plane of said tetrahedral elements; and seventh means for establishing new tetrahedral elements by connecting said new nodal point with peaks of said retrieved tetrahedral elements and said new tetrahedral elements.

17. A system as set forth in claim 16, further comprising:
means for repeating the fifth means for judging whether said distance is within the predetermined distance range and the sixth means for adding the new tetrahedral elements which interface with said tetrahedral elements having the outermost triangular plane, until all of the retrieved outermost tetrahedral elements are processed.

18. A method as set forth in claim 16, further comprising:
means for registering all of the retrieved tetrahedral elements in a first list;

means for registering all of the retrieved outermost tetrahedral elements in a second list;

wherein said sixth means adds the new tetrahedral elements to the retrieved outermost tetrahedral elements by registering said new tetrahedral elements in said first and second lists; and wherein said seventh means connects said new nodal point with the peaks of said tetrahedral elements registered in said first list.

* * * * *